(12) United States Patent
Lin et al.

(10) Patent No.: US 11,990,319 B2
(45) Date of Patent: May 21, 2024

(54) METHODS AND APPARATUS FOR PROCESSING A SUBSTRATE

(71) Applicant: Applied Materials, Inc., Santa Clara, CA (US)

(72) Inventors: Yida Lin, Santa Clara, CA (US); Rui Li, San Jose, CA (US); Martin Lee Riker, Round Rock, TX (US); Haitao Wang, Fremont, CA (US); Noufal Kappachali, San Jose, CA (US); Xiangjin Xie, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 344 days.

(21) Appl. No.: 17/568,836

(22) Filed: Jan. 5, 2022

(65) Prior Publication Data
US 2023/0230806 A1    Jul. 20, 2023

(51) Int. Cl.
*H01J 37/32*    (2006.01)
*B23K 15/00*    (2006.01)

(52) U.S. Cl.
CPC .... *H01J 37/32183* (2013.01); *B23K 15/0006* (2013.01); *H01J 2237/327* (2013.01)

(58) Field of Classification Search
CPC .......... H01J 37/32183; H01J 2237/327; B23K 15/0006
See application file for complete search history.

(56) References Cited

U.S. PATENT DOCUMENTS

| 5,892,198 | A | 4/1999 | Barnes et al. |
| 7,839,223 | B2 | 11/2010 | Van Zyl et al. |
| 8,773,019 | B2 | 7/2014 | Coumou et al. |
| 11,043,387 | B2 * | 6/2021 | Ramaswamy .... H01J 37/32137 |
| 11,651,966 | B2 * | 5/2023 | Ramaswamy .... H01J 37/32568 438/710 |
| 11,721,525 | B2 * | 8/2023 | Guo .................. H01J 37/32091 315/111.21 |
| 2009/0218324 | A1 | 9/2009 | Or et al. |
| 2009/0294061 | A1 | 12/2009 | Shannon et al. |
| 2009/0295295 | A1 | 12/2009 | Shannon et al. |
| 2009/0295296 | A1 | 12/2009 | Shannon et al. |

(Continued)

FOREIGN PATENT DOCUMENTS

| KR | 10-2017-0040001 A | 4/2017 |
| WO | WO 2020-256899 A1 | 12/2020 |

OTHER PUBLICATIONS

PCT International Search Report and Written Opinion for PCT/US2022/035267 dated Oct. 27, 2022.

*Primary Examiner* — Adolf D Berhane
(74) *Attorney, Agent, or Firm* — MOSER TABOA

(57) ABSTRACT

Methods and apparatus for processing a substrate are provided herein. For example, an RF power delivery compensation circuit comprises a first input configured to receive an RF forward power from an RF power source connected to a processing chamber and a second input configured to receive an RF delivered power from a matching network connected between the RF power source and the processing chamber. The RF power delivery compensation circuit calculates an RF forward power compensation factor based on the RF forward power and the RF delivered power for adjusting the RF forward power delivered to the processing chamber during operation.

20 Claims, 2 Drawing Sheets

(56) References Cited

U.S. PATENT DOCUMENTS

| | | |
|---|---|---|
| 2020/0286714 A1 | 9/2020 | Kubota |
| 2021/0313152 A1 | 10/2021 | Luo et al. |
| 2021/0351006 A1 | 11/2021 | Prager et al. |
| 2023/0298857 A1* | 9/2023 | Bhowmick ....... H01J 37/32183 315/111.21 |
| 2023/0326721 A1* | 10/2023 | Smyka .............. H01J 37/32183 315/111.21 |

* cited by examiner

METHODS AND APPARATUS FOR PROCESSING A SUBSTRATE

FIELD

Embodiments of the present disclosure generally relate to methods and apparatus for processing a substrate, for example, to methods and apparatus that use power compensation mechanisms to ensure accurate power delivery to radio frequency (RF) systems under the impact of impedance.

BACKGROUND

Impedance matching networks used during plasma substrate (wafer) processing are known. In some RF systems, cable ohmic loss and reflective power can impact actual power delivered to a plasma reactor (chamber) and can affect process performance. Conventional methods and apparatus used to compensate cable ohmic loss apply a constant compensation factor measured from a resistive load. For example, the constant compensation factor can be predetermined by linear fitting between an RF generator output power and a load power, and the constant compensation factor remains unchanged until a next calibration. For example, conventional methods and apparatus add additional forward power to compensate for non-zero reflective power, e.g., $P_{fwd}=P_{sp}+P_{ref}$. Such methods and apparatus, however, are static and limited in accuracy and robustness, which can lead to process drift. Power compensation for non-impedance matched power delivery is therefore necessary to eliminate process drift. The exact power compensation, however, directly depends on the reflected power, which cannot be predetermined and is very sensitive to system condition. For example, conventional methods and apparatus do not consider non-scalable ohmic loss from, for example, electrical components, are not capable of adjusting power loss due to heating or chamber condition change, and net power delivered to a matching network connected to the plasma reactor and/or to the substrate (wafer) is not correctly compensated when reflective power is high.

SUMMARY

Methods and apparatus for processing a substrate are provided herein. In some embodiments, for example, an RF power delivery compensation circuit comprises a first input configured to receive an RF forward power from an RF power source connected to a processing chamber and a second input configured to receive an RF delivered power from a matching network connected between the RF power source and the processing chamber. The RF power delivery compensation circuit calculates an RF forward power compensation factor based on the RF forward power and the RF delivered power for adjusting the RF forward power delivered to the processing chamber during operation.

In accordance with at least some embodiments, a method for processing a substrate comprises receiving an RF forward power from an RF power source connected to a processing chamber, receiving an RF delivered power from a matching network connected between the RF power source and the processing chamber, and calculating an RF forward power compensation factor based on the RF forward power and the RF delivered power for adjusting the RF forward power delivered to the processing chamber during operation.

In accordance with at least some embodiments, a non-transitory computer readable storage medium has instructions stored thereon that when executed by a processor perform a method for processing a substrate. The methods, for example, comprises receiving an RF forward power from an RF power source connected to a processing chamber, receiving an RF delivered power from a matching network connected between the RF power source and the processing chamber, and calculating an RF forward power compensation factor based on the RF forward power and the RF delivered power for adjusting the RF forward power delivered to the processing chamber during operation.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
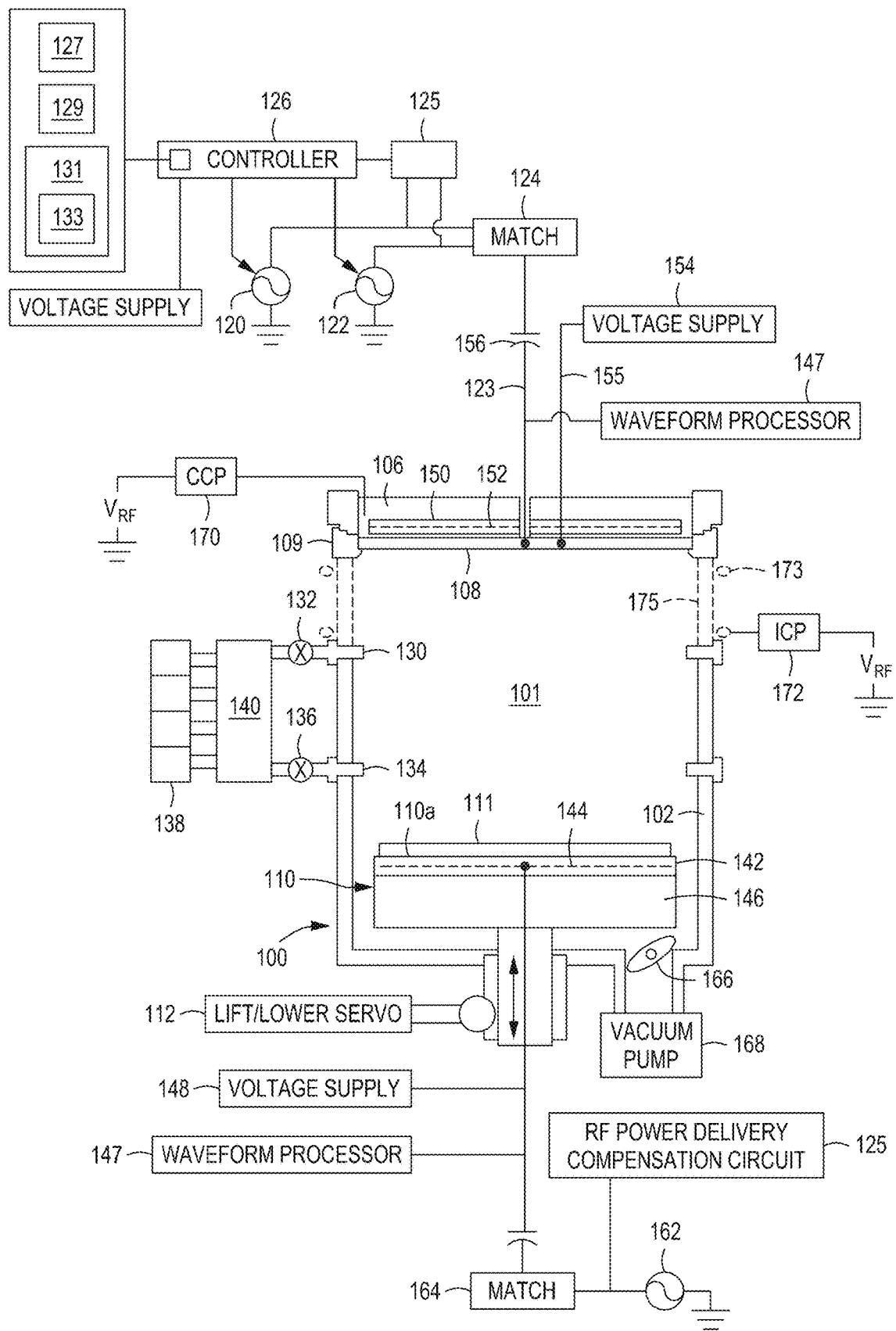
FIG. 1 is a schematic diagram of an apparatus for processing a substrate, in accordance with one or more embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, an RF power delivery compensation circuit comprises a first input configured to receive an RF forward power from an RF power source connected to a processing chamber and a second input configured to receive an RF delivered power from a matching network connected between the RF power source and the processing chamber. The RF power delivery compensation circuit calculates an RF forward power compensation factor based on the RF forward power and the RF delivered power for adjusting the RF forward power delivered to the processing chamber during operation. The methods and apparatus described herein are dynamic, very accurate and robust, which can reduce, if not eliminate process drift. Moreover, the methods and apparatus described herein consider non-scalable ohmic loss from, for example, electrical components, are capable of adjusting power loss due to heating or chamber condition change, and can compensate for net power delivered to a matching network connected to the plasma reactor and/or to the substrate (wafer), e.g., even when reflective power is relatively high.

FIG. 1 is a schematic diagram of an apparatus for processing a substrate, in accordance with one or more embodiments of the present disclosure. The apparatus is suitable for etching one or more substrates (wafers) using an electron beam (ebeam). Accordingly, in at least some embodiments, the apparatus is a processing chamber 100 (e.g., a plasma processing chamber, such as an ebeam process chamber) that is configured to perform ebeam induced etching (EBIE). The processing chamber 100 has a chamber body 102 which defines a process volume 101. In an embodiment, the chamber body 102 has a substantially cylindrical shape and may be fabricated from a material suitable for maintaining a vacuum pressure environment therein, such as metallic materials, for example aluminum or stainless steel.

A ceiling 106 is coupled to the chamber body 102 and forms the process volume 101. The ceiling 106 is formed from an electrically conductive material, such as the materials utilized to fabricate the chamber body 102. The ceiling 106 is coupled to and supports an electrode 108 (e.g., an upper electrode). In some embodiments, the electrode 108 is coupled to the ceiling 106 such that the electrode 108 is disposed adjacent or within the process volume 101. The electrode 108 is formed from a process-compatible material having a high secondary electron emission coefficient, e.g., a secondary electron emission coefficient, of about 5 to about 10. Materials having relatively high secondary emission coefficients can include, but are not limited to, silicon, carbon, silicon carbon materials, or silicon-oxide materials. Alternatively, the electrode 108 can be formed from a metal oxide material such as aluminum oxide ($Al_2O_3$), yttrium oxide ($Y_2O_3$), or zirconium oxide (ZrO2). A dielectric ring 109, which is formed from an electrically insulating material, is coupled to the chamber body 102 and surrounds the electrode 108. As illustrated, the dielectric ring 109 is disposed between the chamber body 102 and the ceiling 106 and supports the electrode 108.

The ceiling 106 can include an insulating layer 150 containing a chucking electrode 152 facing the electrode 108. In at least some embodiments, a DC voltage power supply 154 can be coupled to the chucking electrode 152 via the feed conductor 155, for electrostatically clamping the electrode 108 to the ceiling 106, and to the electrode 108 for applying a DC power (e.g., a voltage potential) thereto. In such embodiments, a DC blocking capacitor 156 can be connected in series with the output of an impedance matching network 124. A controller 126 functions to control the DC voltage power supply 154.

Mechanical contact between the electrode 108 and the ceiling 106 is sufficient to maintain high thermal conductance between the electrode 108 and the ceiling 106. Additionally, a force of the mechanical contact can be regulated by the electrostatic clamping force provided by the DC voltage power supply 154.

In one or more embodiments, the ceiling 106 is electrically conductive and in electrical contact with the electrode 108. Power from the impedance matching network 124 is conducted through the ceiling 106 to the electrode 108. In one or more embodiments, the chamber body 102 can be maintained at ground potential. In one or more embodiments, grounded internal surfaces (i.e., chamber body 102) inside the processing chamber 100 can be coated with a process compatible material such as silicon (Si), carbon (C), silicon carbon (SiC) materials, or silicon-oxide (SiO) materials, aluminum oxide ($Al_2O_3$), yttrium oxide ($Y_2O_3$), or zirconium oxide ($ZrO_2$).

In some embodiments, internal passages (not shown) for conducting a thermally conductive liquid or media inside the ceiling 106 are connected to a thermal media circulation supply. The thermal media circulation supply acts as a heat sink or a heat source.

A pedestal 110 is disposed in the process volume 101. The pedestal 110 supports a substrate 111 (e.g., semiconductor wafers, such as silicon wafers, or glass panels or other substrates, such as for solar cell, display, or other applications) thereon and has a substrate support surface 110a oriented parallel to the electrode 108. In an embodiment, the pedestal 110 is movable in the axial direction by a lift servo 112. During operation, an upper electrode, such as the electrode 108, is maintained at one or more distances (e.g., a process position) from the substrate support surface 110a. For example, in at least some embodiments, the electrode 108 is maintained from a process position for processing a substrate at a distance from about 1 inch to about 20 inches. For example, in at least some embodiments, the distance can be about 6 inches to about 10 inches.

The controller 126 is provided and coupled to various components of the processing chamber 100 to control the operation of the processing chamber 100 for processing a substrate. The controller 126 includes a central processing unit 127, support circuits 129 and a memory 131, which can be a non-transitory computer readable storage medium having instructions thereon to perform the methods described herein. The controller 126 is operably coupled to and controls one or more energy sources directly, or via computers (or controllers) associated with the processing chamber 100 and/or support system components. The controller 126 may be any form of general-purpose computer processor that can be used in an industrial setting for controlling various chambers and sub-processors. The memory 131, or non-transitory computer readable storage medium, of the controller 126 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 129 are coupled to the central processing unit 127 for supporting the central processing unit 127 in a conventional manner. The support circuits 129 include cache, power supplies, clock circuits, input/output circuitry and subsystems, and the like. Inventive methods as described herein, such as the method for processing a substrate (e.g., EBIE of a substrate), may be stored in the memory 131 as software routine 133 that may be executed or invoked to control the operation of the one or more energy sources in the manner described herein. The software routine 133 may also be stored and/or executed by a second central processing unit (not shown) that is remotely located from the hardware being controlled by the central processing unit 127.

In one or more embodiments, the pedestal 110 can include an insulating puck 142 which forms the substrate support surface 110a, a lower electrode 144 disposed inside the insulating puck 142, and a chucking voltage supply 148 connected to the electrode 144. Additionally, in at least some embodiments, a base layer 146 underlying the insulating puck 142 can include one or more internal passages (not shown) for circulating a thermal transfer medium (e.g., a liquid) from a circulation supply. In such embodiments, the circulation supply can function as a heat sink or as a heat source.

One or more RF power generators can be coupled to the processing chamber 100. In at least some embodiments, a high frequency RF power source 120 having a frequency from about 20 MHz to about 200 MHz and a low frequency RF power source 122 having a frequency from about 100 kHz to about 20 MHz are coupled to the electrode 108 through, for example, the impedance matching network 124 via an RF feed conductor 123 (RF transmission line). In at least some embodiments, the one or more RF generators can comprise a single RF source having a frequency from about 100 kHz to about 200 MHz. The RF feed conductor 123 from the impedance matching network 124 can be connected to the electrode support or ceiling 106 rather than being directly connected to the electrode 108. In such embodiments, RF power from the RF feed conductor 123 can be capacitively coupled from the electrode support to the electrode 108. The impedance matching network 124 is adapted to provide an impedance match at different frequencies of the high frequency RF power source 120 and the low frequency RF power source 122, as well as filtering to isolate the high frequency RF power source 120 and the low frequency RF power source 122 from one another. Output power levels of the high frequency RF power source 120 and the low frequency RF power source 122 can be independently controlled by the controller 126.

With the high frequency RF power source 120 and the low frequency RF power source 122, radial plasma uniformity in the process volume 101 can be controlled by selecting a distance (e.g., from about 6 inches to about 10 inches) between the electrode 108 and pedestal 110. For example, in some embodiments, a lower VHF frequency produces an edge-high radial distribution of plasma ion density in the process volume 101 and an upper VHF frequency produces a center-high radial distribution of plasma ion density. With such a selection, the power levels of the high frequency RF power source 120 and the low frequency RF power source 122 are capable of generating a plasma with a substantially uniform radial plasma ion density.

Upper gas injectors 130 provide process gas into the process volume 101 through a first valve 132, and lower gas injectors 134 provide process gas into the process volume 101 through a second valve 136. The upper gas injectors 130 and the lower gas injectors 134 can be disposed in sidewalls of the chamber body 102. Process gas is supplied from an array of process gas supplies such as gas supplies (e.g., gas source) 138 through an array of valves 140 which are coupled to the first valve 132 and second valve 136. Process gas species and gas flow rates delivered into the process volume 101 can be independently controllable. For example, gas flow through the upper gas injectors 130 may be different from gas flow through the lower gas injectors 134. The controller 126 governs the array of valves 140.

In embodiments, one or more inert gases, such as argon (Ar), helium (He) (or other inert gas), and/or one or more reactive gases, such as methane ($CH_4$), acetylene ($C_2H_2$), hydrogen ($H_2$), hydrogen bromide (HBr), ammonia ($NH_3$), disilane ($Si_2H_6$), nitrogen trifluoride ($NF_3$), tetrafluoromethane ($CF_4$), sulfur hexafluoride ($SF_6$), carbon monoxide (CO), carbonyl sulfide (COS), trifluoromethane ($CHF_3$), hexafluorobutadiene ($C_4F_6$), chlorine ($Cl_2$), nitrogen ($N_2$), oxygen ($O_2$), combinations thereof, and the like can be supplied into the process volume 101 through either or both the upper gas injectors 130 and the lower gas injectors 134. In some embodiments, the process gas delivered to the process volume 101 adjacent the electrode 108 can accelerate secondary electrons toward the substrate 111, as will be described in greater detail below, and/or buffer the electrode 108 from a reactive plasma formed in the process volume 101, thus increasing the useful life of the electrode 108.

In accordance with the present disclosure, plasma is generated in the process volume 101 by various bulk and surface processes, for example, by capacitive coupling 170 (e.g., capacitive coupling plasma (CCP)) and/or inductive coupling 172 (e.g., inductive coupling plasma (ICP)). Inductively coupled power or high frequency capacitively coupled power can be used to achieve independent control of plasma density, aside from bias power controlling ion energy. Accordingly, when the processing chamber 100 is configured for use with the capacitive coupling 170 (e.g., configured as a CCP reactor), source power can refer to a higher frequency (compared to bias) power being applied to either a bias electrode (e.g., the electrode 144), which supports the substrate 111, or the upper electrode, e.g., the electrode 108. Alternatively or additionally, when the processing chamber 100 is configured for use with the inductive coupling 172 (e.g., configured as an ICP reactor), the source power refers to power applied to a coil 173 (shown in phantom in FIG. 1). When the processing chamber 100 is configured as an ICP reactor, a dielectric window 175 (also shown in phantom) is provided on a side of the chamber body 102 of the processing chamber 100. The dielectric window 175 is configured to provide a vacuum boundary and a window for electromagnetic wave exciting plasma.

Ions generated by a CCP or ICP are influenced by an electric field that encourages ion bombardment of the electrode 108 by the ions generated from the plasma, as will be described in greater detail below. Moreover, depending on a mode of operation of the processing chamber 100, ion bombardment energy of the electrode 108 can be a function of a power supplied to the electrode 108, e.g., provided by one or more of the DC voltage power supply 154, the low frequency RF power source 122, or the high frequency RF power source 120. For example, in at least some embodiments, ion bombardment energy of the electrode 108 can be provided by application of voltage from one or both the DC voltage power supply 154 and the low frequency RF power source 122. In at least some embodiments, in addition to using one or both the DC voltage power supply 154 and the low frequency RF power source 122, the high frequency RF power source 120 can be used to increase plasma density and ebeam flux.

When the DC voltage power supply 154 is used to supply power (e.g., bias) to the electrode 108, the power supplied by the DC voltage power supply 154 can be about 1 W to about 30 kW (e.g., about −1560V to about −1440V). Similarly, when the low frequency RF power source 122 is used to supply power (e.g., bias) to the electrode 108, the power supplied by the low frequency RF power source 122 can be about 1 W to about 30 KW with a frequency from about 100 kHz and about 20 MHz. Likewise, when the high frequency RF power source 120 is used in conjunction with either or both the DC voltage power supply 154 and the low frequency RF power source 122, the power supplied by the high frequency RF power source 120 can be about 1 W to about 10 kW with a frequency from about 20 MHz and about 200 MHz.

In some embodiments, an RF bias power source 162 can be coupled through an impedance matching network 164 to an electrode 144 of the pedestal 110. The RF bias power source 162 is configured to accelerate ions onto the substrate 111. The RF bias power source 162 can be configured to provide low frequency RF power and/or high frequency RF power. For example, in at least some embodiments, the RF bias power source 162 can be configured to supply 1 W to 30 kW of power to the electrode 144 at one or more frequencies, e.g., of about 100 kHz to about 200 MHz. In some embodiments, for example, the RF bias power source 162 can be configured to supply 1 W to 30 kW of power to the electrode 144 at a frequency of about 100 kHz to about 100 MHz.

An RF power delivery compensation circuit 125 can be connected between the RF bias power source 162 and the impedance matching network 164. The RF power delivery compensation circuit 125 is configured to calculate an RF forward power compensation factor $P_{COMP}$ based on an RF forward power and an RF delivered power for adjusting the RF forward power delivered to the processing chamber 100 during operation, as described in greater detail below. Likewise, in at least some embodiments, the RF power delivery compensation circuit 125 can be connected between the high frequency RF power source 120 and/or the low frequency RF power source 122 and the impedance matching network 124. The controller 126 controls the RF power delivery compensation circuit 125. Alternatively or additionally, the RF power delivery compensation circuit 125 comprises an independent controller (e.g., configured in a manner substantial identical to the controller 126) that is in operative communication with the controller 126.

Additionally, a waveform tailoring processor 147 may be connected between an output of the impedance matching network 164 and the electrode 144 and/or an output of the impedance matching network 124 and the electrode 108. The waveform tailoring processor 147 controller can be configured to change a waveform produced by the RF bias power source 162 and/or the high frequency RF power source 120 and the low frequency RF power source 122 to a desired waveform. The ion energy of plasma near the substrate 111 and/or the electrode 108 can be controlled by the waveform tailoring processor 147. For example, in some embodiments, the waveform tailoring processor 247 produces a waveform in which an amplitude is held during a certain portion of each RF cycle at a level corresponding to a desired ion energy level. The controller 126 controls the waveform tailoring processor 147.

Etching of the substrate 111 can be also influenced by one or more factors. For example, pressure (in addition to ebeam energy, ebeam plasma power, and bias power if used) can influence etching of the substrate 111. Accordingly, in an embodiment, a pressure maintained in the process volume 101 during EBIE of the substrate 111 can be between about 0.1 mTorr to about 300 mTorr. For example, in at least some embodiments, such as when ebeam neutralization and etch profile control are necessary, a pressure maintained in the process volume 101 during EBIE of the substrate 111 can be between about 0.1 mTorr to about 30 mTorr. Likewise, in at least some embodiments, such as when ebeam neutralization and etch profile control are not necessary and bias power is not needed, a pressure maintained in the process volume 101 during EBIE of the substrate 111 can be between about 0.1 mTorr to about 100 mTorr. The pressure is generated by a vacuum pump 168 which is in fluid communication with the process volume 101. The pressure is regulated by a gate valve 166 which is disposed between the process volume 101 and the vacuum pump 168. The controller 126 controls the vacuum pump 168 and/or the gate valve 166.

The inventors have found that in cases where impedance mismatch is inevitable, correct power compensation is desired. For example, for one or more levels during a dual-level-pulsing (DLP) process, impedance mismatch can be quite severe when the power difference between two levels is great, e.g., 80 W and 900 W. Even with other optimization mechanisms, low-level power reflection usually cannot be suppressed below 20%. Accordingly, the methods and apparatus described herein accounts for the power loss of each level simultaneously and computes the compensation in a real time based on the feedback, e.g., from high-speed sensors, to maintain long-term processing accuracy under different conditions.

Figure 2:
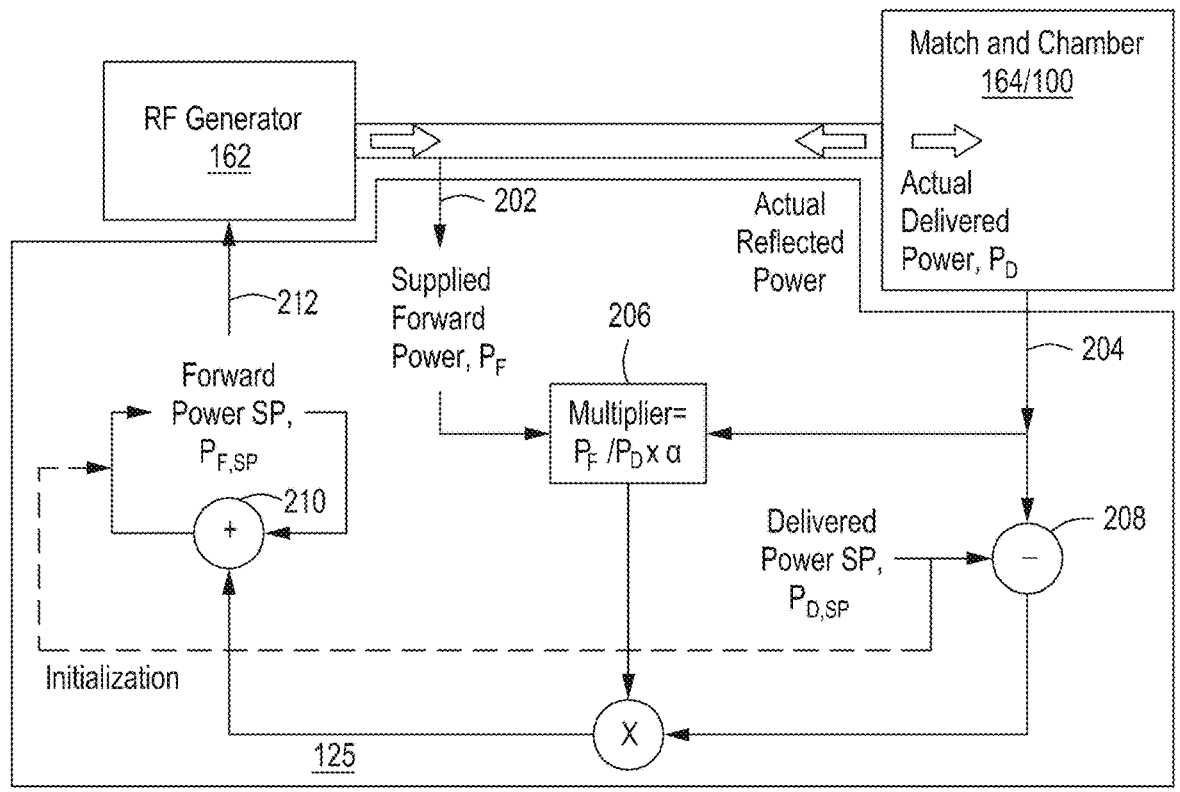
FIG. 2 is a block diagram of an RF power delivery compensation circuit configured for use with the apparatus for processing a substrate of FIG. 1, in accordance with one or more embodiments of the present disclosure.
Figure 3:
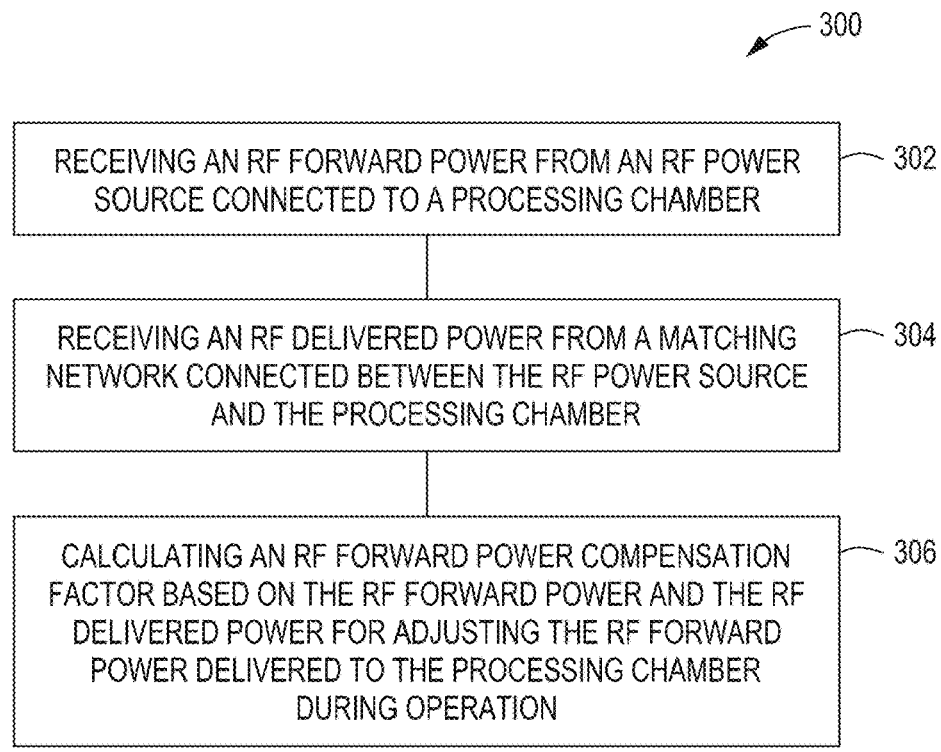
FIG. 3 is a flowchart of a method for processing a substrate and configured for use with the apparatus for processing a substrate of FIG. 1, in accordance with one or more embodiments of the present disclosure.

For example, FIG. 2 is a block diagram of the RF power delivery compensation circuit 125, and FIG. 3 is a flowchart of a method 300 for processing a substrate and configured for use with the processing chamber 100 of FIG. 1, in accordance with one or more embodiments of the present disclosure.

The method 300 can be performed using, for example, a processing chamber that is configured for performing EBIE of a substrate, e.g., the processing chamber 100. For illustrative purposes, the processing chamber is assumed configured as a CCP reactor configured for EBIE of a substrate, e.g., the substrate 111, which can be, for example, a 150 mm, 200 mm, 300 mm, 450 mm substrate, etc. For example, in at least some embodiments, the substrate can be a 300 mm substrate, such as a semiconductor wafer or the like. As can be appreciated, the herein described power/voltages and/or pulsing/duty cycles can be scaled accordingly, e.g., for substrates having diameters greater or less than 300 mm. Initially, one or more of the above described process gases can be introduced into a process volume, e.g., the process volume 101, of the processing chamber 100. For example, in at least some embodiments, the process gas can be one or more of He, Ar, and the like (or other inert gas), and/or Hz, HBr, $NH_3$, $Si_2H_6$, $CH_4$, $C_2H_2$, $NF_3$, $CF_4$, $SF_6$, CO, COS, $CHF_3$, $C_4F_6$, $Cl_2$, $N_2$, $O_2$, and the like (or other reactive gas). Additionally, the process volume can be maintained at one or more operating pressures from about 0.1 mTorr to about 300 mTorr.

In at least some embodiments, the RF power delivery compensation circuit 125 can be provided/initialized with one or more power levels (e.g., a user input). For example, in at least some embodiments, the RF power delivery compensation circuit 125 can be initialized at about 100 W (e.g., $P_{INIT}$). The initial power at the RF bias power source 162 is an arbitrary number that is provided when an initial bias is turned on and applied to, for example, the electrode 144, e.g., $P_{INIT}$ is equal to $P_{F,SP}$.

Next, at 302, the method 300 comprises receiving an RF forward power from an RF power source (e.g., the RF bias power source 162, the high frequency RF power source 120 and/or the low frequency RF power source 122) connected to a processing chamber (e.g., the processing chamber 100). For example, the RF power delivery compensation circuit 125 comprises a first input 202 configured to receive a forward power $P_F$ from the RF bias power source 162, and a value of the forward power $P_F$ (e.g., measured at the RF bias power source 162) is supplied to a multiplier 206 connected to the first input 202 of the RF power delivery compensation circuit 125. For example, as the RF power delivery compensation circuit 125 is initialized at 100 W, the RF bias power source 162 is also be initialized to provide 100 W of RF power to the processing chamber 100. In some instances, however, the RF bias power source 162 transmits/measures a slightly greater amount of RF power (e.g., 100.2 W) to the processing chamber 100, which can be due to processing chamber conditions, drift, etc. The multiplier 206 can include conventional circuitry suitable for performing the multiplier functions described herein.

Next, at 304, the method 300 comprises receiving an RF delivered power from a matching network (e.g., the impedance matching network 164 and/or the impedance matching network 124) connected between the RF power source (e.g., the RF bias power source 162, the high frequency RF power source 120 and/or the low frequency RF power source 122) and the processing chamber 100. For example, the RF power delivery compensation circuit 125 comprises a second input 204 that is configured to receive an RF delivered power $P_D$ from the impedance matching network 164 (e.g., measured at the impedance matching network 164) and/or the processing chamber 100. For illustrative purposes, the actual delivered power to the impedance matching network 164 (and/or the processing chamber 100) can be about 88 W and supplied to the multiplier 206 also connected to the second input 204 of the RF power delivery compensation circuit 125.

Next, at 306, the method 300 comprises calculating the RF forward power compensation factor $P_{COMP}$ based on the RF forward power $P_F$ and the RF delivered power $P_D$, e.g., for adjusting the RF forward power delivered to the processing chamber during operation. In at least some embodiments, the method 300 comprises calculating the RF forward power compensation factor $P_{COMP}$ based on an iteration (e.g., a first iteration, a second iteration, a third iteration, a fourth, iteration, and so on) of the RF forward power $P_F$.

For example, during the initialization process (e.g., when the RF bias is turned on), the method 300 comprises calculating a power multiplier $P_M$ that is equal to the RF delivered power $P_D$ divided by the RF forward power $P_F$. For example, the RF power delivery compensation circuit 125 is configured to calculate the power multiplier $P_M$ by dividing the forward power $P_F$ (e.g., 100 W) by the RF delivered power $P_D$ (e.g., 88 W), which is equal to 1.139. In at least some embodiments, the method 300 comprises multiplying the power multiplier $P_M$ (e.g., 1.139) by an optional dynamic parameter α that can be used to at least one of accelerate or stabilize calculation of the RF forward power compensation factor $P_{COMP}$ during operation. For example, the dynamic parameter α can be manually adjusted to a constant so that an α<1 reduces the compensation magnitude and helps mitigate overcompensation issues at each iteration and an α>1 increases the compensation magnitude and help under compensation issues at each iteration. Moreover, the dynamic parameter α can be dynamically adjusted (or self-adaptive) starting from 1, based on a trend of a power deficit from iterations. For example, as disclosed below, when a targeted delivered power is about 100 W, a real delivered power can be about 33 W, 133.9 W, 90 W, 103.3 W and 99.5 W for each iteration. Thus, in each iteration the compensation is a bit more than needed so that the delivered power fluctuates above and below the 100 W line (can also be seen from alternating signs of power deficit). The system can automatically change a at each iteration based on the previous results. In at least some embodiments, the system can adjust a checking if a compensation amount of the previous iteration, and the deficit of the current iteration have the same (opposite) sign. If yes, a can be increased (decreased) by, for example, 0.05 for each iteration, to help stabilize the compensation. In at least some embodiments, a lower and an upper limit for a can be set, e.g., 0.6 and 1.4 to help prevent extreme cases.

As noted above, the RF power delivery compensation circuit 125 is initialized at 100 W. In at least some embodiments, at 306, the method 300 further comprises calculating a power deficit $P_{DEF}$ that is equal to the RF delivered power $P_D$ subtracted from the user input initialized power of $P_{INIT}$ 100 W. For example, the RF power delivery compensation circuit 125 comprises a substrator 208 configured to calculate the power deficit $P_{DEF}$ that is equal to the RF delivered power $P_D$ (e.g., 88 W) subtracted from the input initialized power of 100 W (which is always present on/at the substrator 208), which is equal to 12 W. The substrator 208 can include conventional circuitry suitable for performing the substrator functions described herein.

In at least some embodiments, the RF forward power compensation factor $P_{COMP}$ is equal to the power multiplier $P_M$ (1.139) multiplied by the power deficit $P_{DEF}$ (e.g., 12 W), which is about equal to 13.67 W. The power deficit $P_{DEF}$ can be a positive (+) value or negative (−) value.

In at least some embodiments, the RF forward power compensation factor $P_{COMP}$ can be at least one of added to or subtracted from the RF forward power $P_F$ depending on a value of the power deficit $P_{DEF}$ to determine $P_{F,SP}$, which has an initial value equal to $P_{INIT}$ (e.g., 100 W). For example, the RF power delivery compensation circuit 125 comprises an adder 210, which is also initialized at $P_{INIT}$ (e.g., 100 W), and at 306 the method 300 comprises adding the 13.67 W (which is positive) to the $P_{F,SP}=P_{INIT}=100$ W, which is about equal to 113.7 W (e.g., the new value of $P_{F,SP}$). The adder 210 is provided at an output 212 of the RF power delivery compensation circuit 125 and connected to an input of the RF bias power source 162. The adder 210 can include conventional circuitry suitable for performing the addition functions described herein.

The method 300 continues as needed during operation of the processing chamber 100, e.g., until a predetermined $P_{COMP}$ is obtained. For example, in the present example, in a first (or next) iteration, $P_{INIT}$ is again equal to 100 W, $P_{F,SP}$ is now equal to about 113.7 W (e.g., previously calculated), $P_F$ can be equal to 113.8 (for illustrative purposes, as $P_F$ is a measured value), $P_D$ can be equal to 99.9 (again for illustrative purposes, as $P_D$ is a measured value), $P_M$ ($P_F/P_D$) is calculated to be equal to about 1.139, $P_{DEF}$ ($P_{INIT}-P_D$) is calculated to be equal to about 0.1 W, and $P_{COMP}$ ($P_M*P_{DEF}$) is calculated to be equal to about 0.11 (e.g., the predetermined value). Alternatively, if the $P_{COMP}$ value of 0.11 is greater than a predetermined value, the $P_{COMP}$ value of 0.11 would be provided to the adder 210 and the RF power delivery compensation circuit 125 would cycle through the second iteration, as previously described. For example, in at least some embodiments, the method 300 can comprise initializing the RF forward power to about 100 W and adjusting the RF forward power from about 100 W to about 305 W within four iterations.

The method 300 and the RF power delivery compensation circuit 125 operates a closed-loop compensation manner, which utilizes readily available real-time samples of various power readings from the RF devices in the closed-loop. The RF power delivery compensation circuit 125 calculates an exact compensation value based on an instantaneous condition of the circuits of the RF power delivery compensation circuit 125 and is updated iteratively during substrate processing. The accuracy of RF power delivery is, therefore, guaranteed regardless of drift of processing chamber and/or circuit conditions.

While the foregoing is directed to embodiments of the present disclosure, other and further embodiments of the disclosure may be devised without departing from the basic scope thereof.

The invention claimed is:
1. An RF power delivery compensation circuit, comprising:
    a first input configured to receive an RF forward power from an RF power source connected to a processing chamber; and
    a second input configured to receive an RF delivered power from a matching network connected between the RF power source and the processing chamber, wherein the RF power delivery compensation circuit calculates an RF forward power compensation factor based on the RF forward power and the RF delivered power for adjusting the RF forward power delivered to the processing chamber during operation.

2. The RF power delivery compensation circuit according to claim 1, wherein the RF power delivery compensation circuit is configured to calculate the RF forward power compensation factor based on an iteration of the RF forward power.

3. The RF power delivery compensation circuit according to claim 1, wherein the RF power delivery compensation circuit is configured to calculate a power multiplier that is equal to the RF forward divided by the RF delivered power.

4. The RF power delivery compensation circuit according to claim 3, wherein the power multiplier is multiplied by a dynamic parameter that is used to at least one of accelerate or stabilize calculation of the RF forward power compensation factor during operation.

5. The RF power delivery compensation circuit according to claim 3, wherein the RF power delivery compensation circuit is configured to calculate a power deficit that is equal to the RF delivered power subtracted from the RF forward power.

6. The RF power delivery compensation circuit according to claim 5, wherein the RF forward power compensation factor is equal to the power multiplier multiplied by the power deficit.

7. The RF power delivery compensation circuit according to claim 1, wherein the RF forward power compensation factor is at least one of added to or subtracted from the RF forward power.

8. The RF power delivery compensation circuit according to claim 1, wherein the RF power delivery compensation circuit is configured to calculate the RF forward power compensation factor based on an initial RF forward power of about 100 W and adjust the RF forward power from about 100 W to about 305 W within four iterations.

9. A method for processing a substrate, comprising:
receiving an RF forward power from an RF power source connected to a processing chamber;
receiving an RF delivered power from a matching network connected between the RF power source and the processing chamber; and
calculating an RF forward power compensation factor based on the RF forward power and the RF delivered power for adjusting the RF forward power delivered to the processing chamber during operation.

10. The method according to claim 9, further comprising calculating the RF forward power compensation factor based on an iteration of the RF forward power.

11. The method according to claim 9, further comprising calculating a power multiplier that is equal to the RF forward divided by RF delivered power.

12. The method according to claim 11, further comprising multiplying the power multiplier by a dynamic parameter that is used to at least one of accelerate or stabilize calculation of the RF forward power compensation factor during operation.

13. The method according to claim 11, further comprising calculating a power deficit that is equal to the RF delivered power subtracted from the RF forward power.

14. The method according to claim 13, wherein the RF forward power compensation factor is equal to the power multiplier multiplied by the power deficit.

15. The method according to claim 9, wherein the RF forward power compensation factor is at least one of added to or subtracted from the RF forward power.

16. The method according to claim 9, further comprising initializing the RF forward power to about 100 W, and adjusting the RF forward power from about 100 W to about 305 W within four iterations.

17. A non-transitory computer readable storage medium having instructions stored thereon that when executed by a processor perform a method for processing a substrate, comprising:
receiving an RF forward power from an RF power source connected to a processing chamber;
receiving an RF delivered power from a matching network connected between the RF power source and the processing chamber; and
calculating an RF forward power compensation factor based on the RF forward power and the RF delivered power for adjusting the RF forward power delivered to the processing chamber during operation.

18. The non-transitory computer readable storage medium according to claim 17, further comprising calculating the RF forward power compensation factor based on an iteration of the RF forward power.

19. The non-transitory computer readable storage medium according to claim 17, further comprising calculating a power multiplier that is equal to the RF forward divided by RF delivered power.

20. The non-transitory computer readable storage medium according to claim 19, further comprising multiplying the power multiplier by a dynamic parameter that is used to at least one of accelerate or stabilize calculation of the RF forward power compensation factor during operation.

* * * * *